(12) United States Patent
Kamiya et al.

(10) Patent No.: US 11,362,679 B2
(45) Date of Patent: Jun. 14, 2022

(54) METHOD AND APPARATUS FOR GENERATING REDUNDANT BITS FOR ERROR DETECTION

(71) Applicant: NEC Corporation, Tokyo (JP)

(72) Inventors: Norifumi Kamiya, Tokyo (JP); Prakash Chaki, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 16/637,385

(22) PCT Filed: Aug. 9, 2017

(86) PCT No.: PCT/JP2017/028942
§ 371 (c)(1),
(2) Date: Feb. 7, 2020

(87) PCT Pub. No.: WO2019/030860
PCT Pub. Date: Feb. 14, 2019

(65) Prior Publication Data
US 2020/0201712 A1   Jun. 25, 2020

(51) Int. Cl.
*H03M 13/27* (2006.01)
*G06F 11/10* (2006.01)

(52) U.S. Cl.
CPC ..... *H03M 13/2792* (2013.01); *G06F 11/1004* (2013.01); *G06F 11/1076* (2013.01); *H03M 13/2739* (2013.01)

(58) Field of Classification Search
CPC ............... H03M 13/2792; H03M 13/2739
See application file for complete search history.

(56) References Cited

U.S. PATENT DOCUMENTS

2010/0131832 A1* 5/2010 Cooper ............... G06F 11/1004
714/807
2016/0079999 A1   3/2016 Shen et al.

FOREIGN PATENT DOCUMENTS

JP           06-21920 A      1/1994
JP        2000-201085 A      7/2000

OTHER PUBLICATIONS

Source: InterDigital Inc.; Title: CRC Polynomial and Interleaver for Polar Code Construction; 3GPP TSG RAN WG1 Meeting #90; R1-1714223; Prague, Czech Republic; Aug. 21-25, 2017 (Year: 2017).*

(Continued)

*Primary Examiner* — Joseph D Torres
(74) *Attorney, Agent, or Firm* — Sughrue Mion, PLLC

(57) ABSTRACT

A redundant bit generating device that generates redundant bits for error detection, that are added to a block of information bits, includes: a redundant bit calculation function that generates a predetermined number of redundant bits from the information bits according to a CRC polynomial; and a bit interleaving function that dispersedly arranges the predetermined number of redundant bits within the information bits using a permutation pattern determined based on the CRC polynomial.

24 Claims, 12 Drawing Sheets

(56) References Cited

OTHER PUBLICATIONS

Source: NEC Corporation; Title: Polar code construction with single CRC polynomial and interleaverSource: 3GPP TSG-RAN WG1 Meeting #90; R1-1712334; Aug. 21-25, 2017 (Year: 2017).*
Ido Tal et al., "List Decoding of Polar Codes," IEEE Transactions on Information Theory, May 2015, pp. 2213-2226, vol. 61, No. 5.
NTT Docomo, "Distributed simple parity check Polar codes," 3GPP TSG RAN WG1 Meeting #88bis, R1-1705757, Apr. 3-7, 2017, pp. 1-6.
International Search Report of PCT/JP2017/028942 dated Nov. 14, 2017.

* cited by examiner

METHOD AND APPARATUS FOR GENERATING REDUNDANT BITS FOR ERROR DETECTION

CROSS REFERENCE TO RELATED APPLICATIONS

This application is a National Stage of International Application No. PCT/JP2017/028942 filed Aug. 9, 2017.

TECHNICAL FIELD

The present invention relates to techniques of generating redundant bits for detecting bit errors included in digital data and of detecting errors using the redundant bits.

BACKGROUND

In the operation of a digital data communication system and a storage system, measures are taken against bit errors that can be caused by various factors. There has been known well a bit error detection method by a cyclic redundancy check (CRC) as the most common technique. The CRC is a technique of detecting bit errors by dividing digital data into blocks of a predetermined constant bit length (k bit), and adding, to each block, the same number of redundant bits as the degree r of a predetermined CRC polynomial.

As is well known, existing encoders sequentially input information bits, generate redundant bits using a polynomial division circuit, and add the redundant bits to the information bits. In such an encoder, given the CRC polynomial: $g(x)=x^r+g_{r-1}x^{r-1}+\ldots+g_1x+1$, a coefficient unit defined by the coefficients $g_{r-1}, \ldots g_1$ is configured by open/close (off/on) switches each indicating 0 or 1. These coefficients (opening/closing state of each switch) are fixed without changing during the processing.

The CRC technique for detecting bit errors is often used together with an error correction technique for correcting bit errors. The error correction technique is a technique for correcting bit errors occurring in data. However, in some rare cases, the correction fails and the data is corrected to data different from the original data. Accordingly, in combination with the CRC technique, it is possible to detect the error even if an error occurs in the correction result. In general, a lot of computation is required for error correction processing. However, It is known that the use of a CRC technique has the effect of reducing the amount of computation on average.

As an example in which a particularly great effect is expected by the combined use of the error correction technique and the CRC technique, a combination of the Polar coding technique and the CRC is well known (Non-Patent Literature (NPL) 1). Common error correction processing of the Polar coding technique does not always derive a single correction result but a predetermined number of correction result candidates. Therefore, the CRC technique can be used as a method for efficiently finding a correct correction result from a plurality of candidates. A candidate for which no error is detected by the CRC is determined as a correct correction result.

Also, as an example of an error detection method, Patent Literature (PTL) 1 discloses a method of: generating redundant bits within a range from the head of a transmission frame including a plurality of blocks to each block as an effective range; and adding the redundant bits to each block.

CITATION LIST

Patent Literature

[PTL 1] Japanese laid-open patent publication H06-021920

Non Patent Literature

[NPL 1] IEEE Transactions on Information Theory, vol. 61, no. 5, pp. 2213-2226, May 2015

SUMMARY

Technical Problem

In the above-described CRC technique, error detection cannot be made without inputting all of the information portion to the decoder. Accordingly, a certain period of time is required for the detection process regardless of the presence or absence of an error. In general, when an error is detected, measures such as a retransmission request is required. If an error exists, it is desirable from the viewpoint of the system configuration to notify the error detection as soon as possible.

In PTL 1 described above, the encoder maintains the initial setting performed at the beginning of the transmission frame, allowing addition of CRC from the beginning to each block. However, PTL 1 provides no descriptions regarding the configuration of the encoder and the decoder. Accordingly, it is considered that the encoder and the decoder in PTL 1 use the existing polynomial division circuit as described above. In other words, in the method disclosed in PTL 1, the encoder provided with the existing polynomial division circuit can only perform addition of a CRC for each block of a predetermined length based on data up to the block.

Therefore, an object of the present invention is to provide a novel method and apparatus capable of avoiding a decrease in detection accuracy and a large increase in the amount of calculation, and capable of generating redundant bits allowing detection of errors using part of information bits.

Solution to Problem

A redundant bit generation device according to the present invention is characterized by including: a redundant bit calculation means that generates a predetermined number of redundant bits from the information bits according to a cyclic redundancy check (CRC) polynomial; and a bit interleaving means that dispersedly arranges the predetermined number of redundant bits within the information bits using a permutation pattern determined based on the CRC polynomial.

A redundant bit generation device according to the present invention is characterized by including: a number of on-off switch means that input the information bits, wherein the number is identical to a count of redundant bits calculated from a cyclic redundancy check (CRC) polynomial; cumulative adding means for calculating the redundant bits by individually accumulating outputs of the number of on-off switch means; a selection means for selecting one of an input information bit and the redundant bits calculated respectively by the cumulative adding means, to generate a data string including the information bits and the redundant bits added thereto; and a control means that controls the on-off switch means and the selection means using a permutation pattern determined based on the CRC polynomial.

A redundant bit generation method according to the present invention is a method for generating redundant bits for error detection, that are added to a block of information bits, characterized by including: by a redundant bit calculation means, generating a predetermined number of redundant bits from the information bits according to a cyclic redundancy check (CRC) polynomial; and by a bit interleaving means, dispersedly arranging the predetermined number of redundant bits within the information bits using a permutation pattern determined based on the CRC polynomial.

A redundant bit generation method according to the present invention is a method for generating redundant bits for error detection, that are added to a block of information bits, characterized by including: by a number of on-off switch means, inputting the information bits and passing or blocking an information bit according to a first control signal, wherein the number is identical to a count of redundant bits calculated from a cyclic redundancy check (CRC) polynomial; by cumulative adding means, calculating the redundant bits by individually accumulating outputs of the number of on-off switch means; by a selection means, selecting one of an input information bit and the redundant bits calculated respectively by the cumulative adding means, to generate a data string including the information bits and the redundant bits added thereto, according to a second control signal; and by a control means, outputting the first control signal and the second control signal for controlling the on-off switch means and the selection means using a permutation pattern determined based on the CRC polynomial.

An error detection apparatus according to the present invention is a device for detecting errors using redundant bits enabling error detection, that are added to a block of information bits, characterized by including: a number of on-off switch means that input the information bits, wherein the number is identical to a count of redundant bits calculated from a cyclic redundancy check (CRC) polynomial; cumulative adding means for calculating the redundant bits by individually accumulating outputs of the number of on-off switch means; a selection means for selecting one of an input information bit and the redundant bits calculated respectively by the cumulative adding means, to generate a data string including the information bits and the redundant bits added thereto; a control means that controls the on-off switch means and the selection means using a permutation pattern determined based on the CRC polynomial; and a decision means for deciding whether an error exists or not, by comparing a redundant bit of the received data to a redundant bit calculated.

A program according to the present invention is a program for functioning a computer as a device for generating redundant bits for error detection, that are added to a block of information bits, the program characterized by implementing on the computer: a redundant bit calculation function that generates a predetermined number of redundant bits from the information bits according to a cyclic redundancy check (CRC) polynomial; and a bit interleaving function that dispersedly arranges the predetermined number of redundant bits within the information bits using a permutation pattern determined based on the CRC polynomial.

A program according to the present invention is a program for functioning a computer as a program for functioning a computer as a device for generating redundant bits for error detection, that are added to a block of information bits, the program characterized by implementing on the computer: a number of on-off switch functions that input the information bits, wherein the number is identical to a count of redundant bits calculated from a cyclic redundancy check (CRC) polynomial; cumulative adding functions for calculating the redundant bits by individually accumulating outputs of the number of on-off switch functions; a selection function for selecting one of an input information bit and the redundant bits calculated respectively by the cumulative adding functions, to generate a data string including the information bits and the redundant bits added thereto; and a control function that controls the on-off switch functions and the selection function using a permutation pattern determined based on the CRC polynomial.

A program according to the present invention is a program for functioning a computer as a device for detecting errors using redundant bits enabling error detection, that are added to a block of information bits, the program characterized by implementing on the computer: a number of on-off switch function that input the information bits, wherein the number is identical to a count of redundant bits calculated from a cyclic redundancy check (CRC) polynomial; cumulative adding functions for calculating the redundant bits by individually accumulating outputs of the number of on-off switch functions; a selection function for selecting one of an input information bit and the redundant bits calculated respectively by the cumulative adding functions, to generate a data string including the information bits and the redundant bits added thereto; a control means that controls the on-off switch functions and the selection function using a permutation pattern determined based on the CRC polynomial; and a decision function for deciding on whether an error exists or not, by comparing a redundant bit of the received data to a redundant bit calculated.

Effects of Invention

According to the present invention, it is possible to avoid a decrease in detection accuracy and a large increase in the amount of calculation, and it is possible to generate redundant bits allowing detection of errors using part of information bits.

DETAILED DESCRIPTION

Outline of Embodiments

According to an embodiment of the present invention, redundant bits can be dispersedly arranged in information bits using a permutation pattern calculated from a cyclic redundancy check (CRC) polynomial. As a result, the redundant bits are arranged within the transmission data frame, allowing detection of an error without inputting all the information bit portions, by which error detection in a short time on average can be achieved. Also, by exchanging bit positions of the transmission data frame, the detection accuracy for the random error is the same as that of the existing CRC technique, that is, the detection accuracy is not deteriorated.

Hereinafter, embodiments and examples of the present invention will be described in detail with reference to the drawings. However, the components described in the following embodiments are merely examples and are not intended to limit the technical scope of the present invention thereto.

1. Embodiment

An encoder according to an embodiment of the present invention can generate a transmission frame in which a plurality of redundant bits are dispersedly arranged in a predetermined-length information bit string by using a permutation pattern obtained from a CRC polynomial. Each redundant bit is generated using the same CRC polynomial from a bit string before the redundant bit, that is, a preceding information bit string, or a preceding information bit string and a redundant bit. Hereinafter, referring to FIG. 1, an example of a data frame generated by encoding according to the present embodiment will be described in detail.

Figure 1:
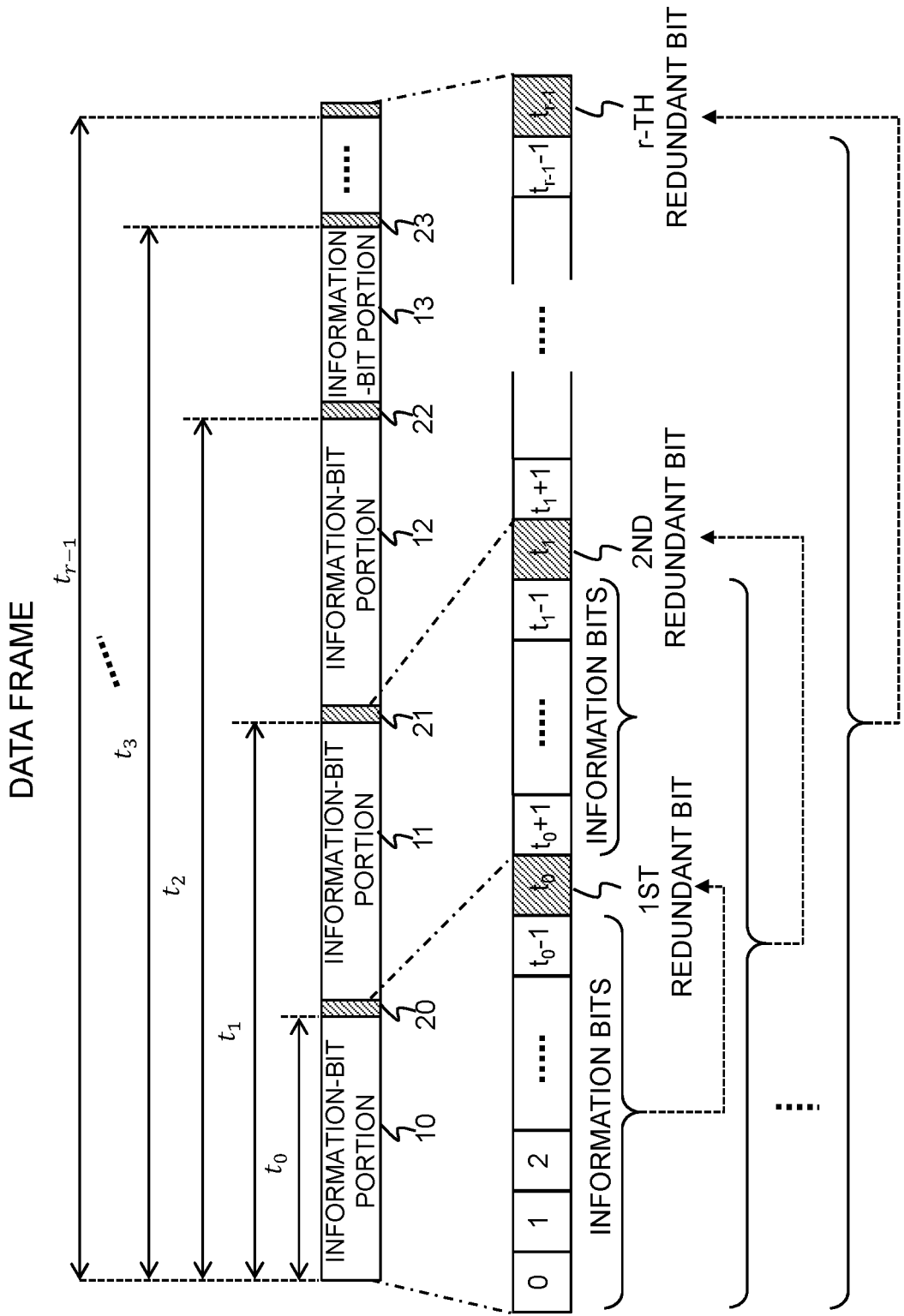
FIG. 1 is a frame configuration diagram illustrating an example of a data frame generated according to an exemplary embodiment of the present invention.

As illustrated in FIG. 1, the data frame is a n-bit data string (code) consisting of k bits of information and r bits of redundancy. The data string has a structure in which information bit portions 10, 11, 12, 13 . . . and redundant bit portions 20, 21, 22, 23 . . . are alternately arranged. The length of each of the information bit portions 10, 11, 12, 13 . . . , in other words, the pattern of the redundant bits arranged in the information bit portions, can be determined by a CRC polynomial as described later. Each redundant bit is generated based on the information bits (or information bits and redundant bits) preceding thereto (located on the left side of the redundant bit).

For example, as shown in FIG. 1, it is assumed that the bits of the data string are numbered in order from the first bit to the (n−1)-th bit, with the first bit being 0, and r redundant bits are located respectively at $t_0$-th bit, $t_1$-th bit, . . . . In this case, the first redundant bit located at the $t_0$-th bit is determined by information bits 0 to ($t_0$−1) located to the left of the first redundant bit. Similarly, the second redundant bit located at the $t_1$-th bit is determined by all bits from 0 to ($t_1$−1) located to the left of it, that is, information bits from 0 to ($t_0$−1), the $t_0$-th first redundant bit and the information bits from ($t_0$−1) to ($t_1$−1). Similarly, the j-th redundant bit is located at the $t_{(j-1)}$-th bit from the left end of the data string, and is determined by all bits from 0 to ($t_{j-1}$−1) located to the left of the $t_{(j-1)}$-th bit.

By dispersing redundant bits as described above, the decoder of the receiving side can use each redundant bit to check whether there is an error in the received data located on the left side. It becomes possible. In other words, the presence or absence of an error can be determined at the point of time when an intermediate redundant bit is read without referring to all the information bits of the received data string, allowing early error detection on average.

2. First Exemplary Embodiment

The distributed arrangement of the redundant bits as illustrated in FIG. 1 can be performed by replacing the bits of the data frame to which the redundant bits are added based on a permutation pattern π described later. Hereinafter, a first exemplary embodiment of the present invention employing this method will be described with reference to FIGS. 2-5.

2.1) Configuration

Figure 2:
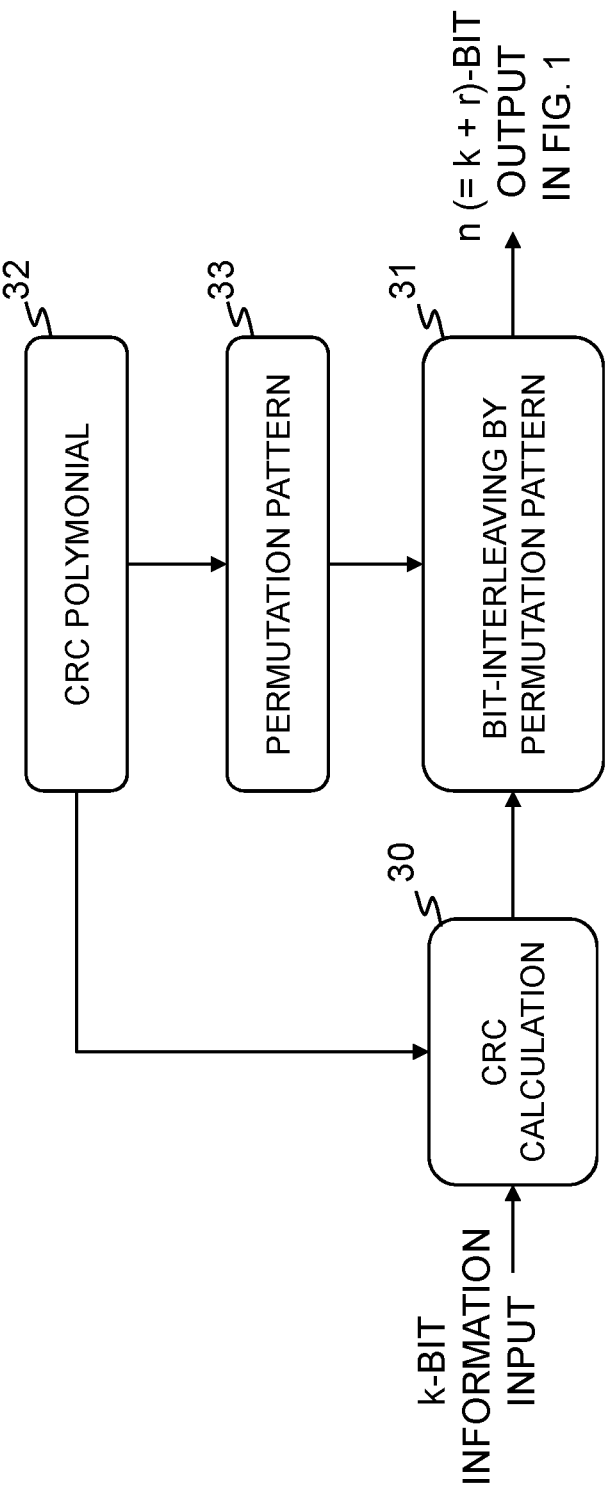
FIG. 2 is a functional configuration diagram for explaining an outline of the redundant bit generation method according to a first exemplary embodiment of the present invention.

As illustrated in FIG. 2, the encoder according to the present exemplary embodiment has a CRC calculation function 30 and a bit interleaving function 31. First, the CRC calculation function 30 calculates a redundant bit by using a CRC polynomial 32 given in advance. Further, the bit interleaving function 31 executes bit interleaving of the bit string obtained by the CRC calculation 30 using the permutation pattern 33 generated from the CRC polynomial 32, to generate the n-bit output in which the redundant bits are arranged in a distributed manner as shown in FIG. 1. Hereinafter, the permutation pattern 33 that enables the distributed arrangement of the redundant bits shown in FIG. 1 will be referred to as a permutation pattern π.

Figure 3:
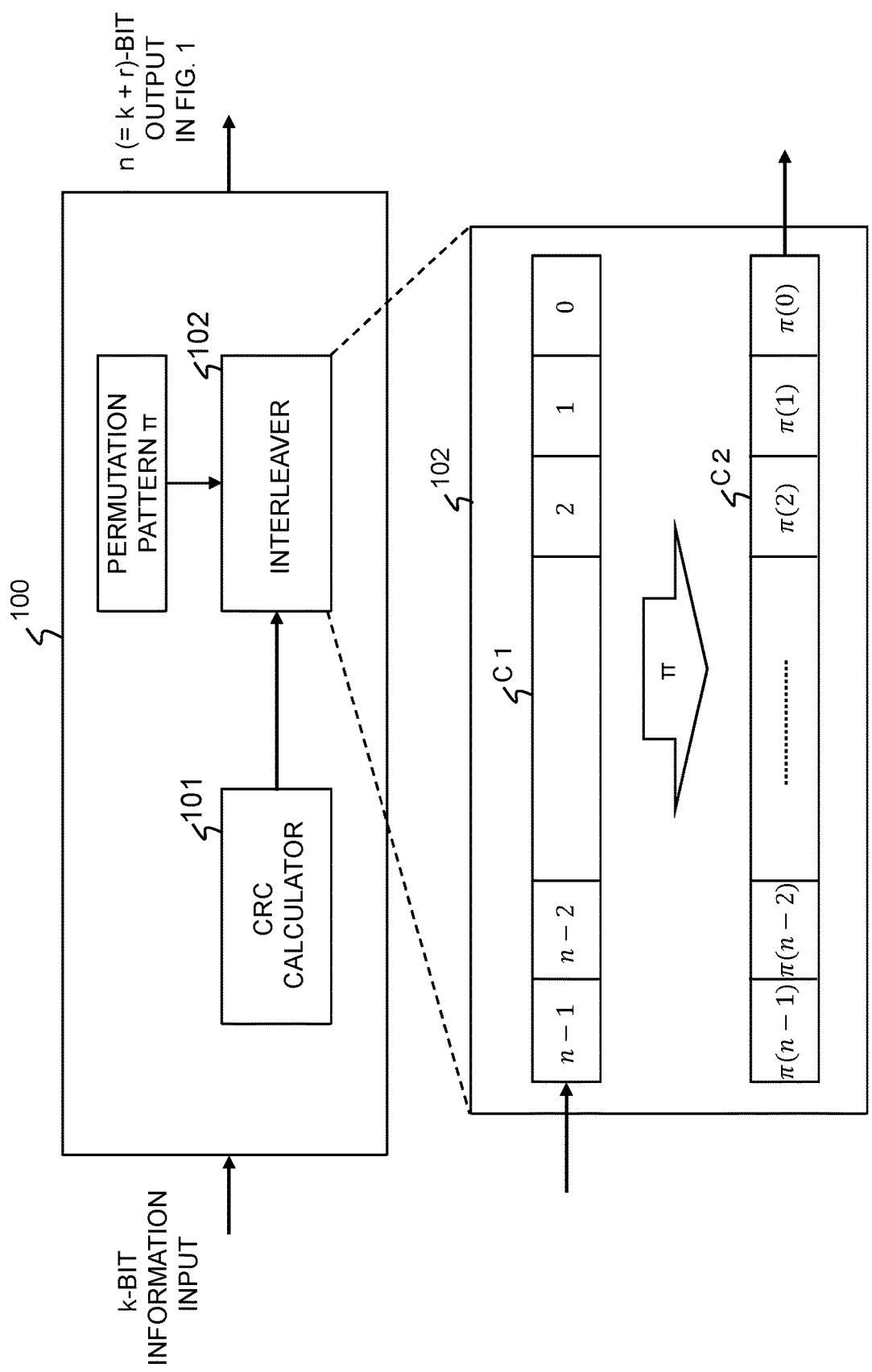
FIG. 3 is a block diagram illustrating an example of the redundant bit generation device according to the first exemplary embodiment.

As illustrated in FIG. 3, the encoder 100 according to the first exemplary embodiment of the present invention includes a CRC calculator 101 and an interleaver 102 provided at a stage subsequent to the CRC calculator 101. The CRC calculator 101 calculates the redundant bits by the CRC calculation as described above and outputs the transmission frame C1 by adding the redundant bits to the information bits. The interleaver 102 uses the permutation pattern π to rearrange bit positions in the transmission frame C1 to output the transmission frame C2 as shown in FIG. 1.

2.2) Procedure for Generating Permutation Pattern π

The permutation pattern π is previously calculated from the CRC polynomial that generates redundant bits by the following procedure and is stored.

Figure 4:
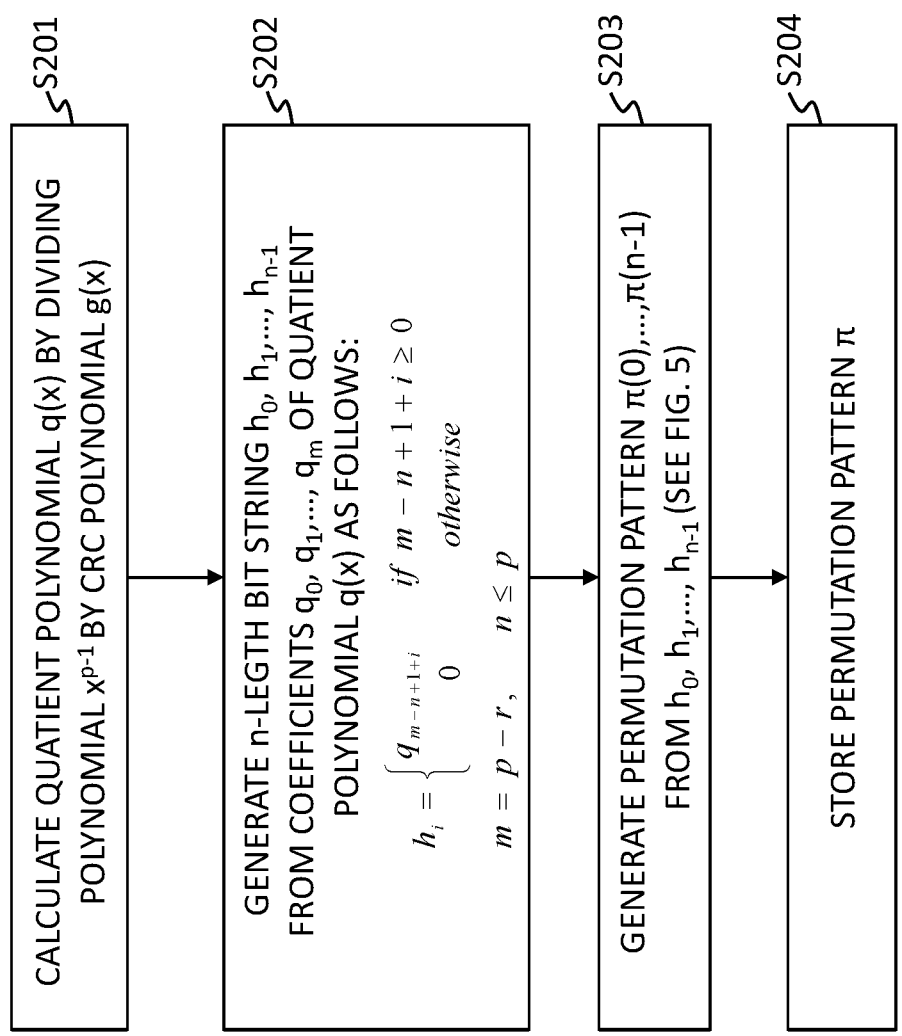
FIG. 4 is a flowchart illustrating an example of a method of generating a permutation pattern in the redundant bit generation device according to the first exemplary embodiment.

As illustrated in FIG. 4, assuming that the degree of the CRC polynomial g(x) is r and the period is p, the quotient polynomial $q(x)=q_0+q_1x+ \ldots +q_mx^m$ is calculated by dividing the polynomial $x^p-1$ by the CRC polynomial $g(x)$ (Operation S201).

Subsequently, from the coefficients $q_0, q_1, \ldots, q_m$ of the quotient polynomial $q(x)$, bit string $h_0, h_1, \ldots, h_{n-1}$ of length n is generated by the following equation (1) (Operation S202).

[Math. 1]
$$h_i = \begin{cases} q_{m-n+1+i} & \text{if } m-n+1+i \geq 0 \\ 0 & \text{otherwise} \end{cases} \quad (1)$$
$$m = p - r, \quad n \leq p$$

Subsequently, the permutation pattern $\pi(0), \pi(1), \ldots \pi(n-1)$ necessary to calculate time points $t_0, t_1, \ldots, t_{r-1}$ at which the redundant bits are output as mentioned above is generated from the generated bit string $h_0, h_1, \ldots, h_{n-1}$ according to a predetermined procedure (see FIG. 5) (Operation S203) and is stored in a memory (Operation S204).

According to the generated permutation pattern $\pi$ as mentioned above, the interleaver 102 interleaves the bits of the data frame C1 and outputs the data frame C2. Note that the permutation pattern $\pi$ indicates an operation of replacing the order of n integers between 0 and n−1 with another order. For example, in the case where n=5 and the order of 0, 1, 2, 3, 4 is rearranged by the permutation pattern $\pi$ to 1, 0, 4, 2, 3, the permutation pattern $\pi$ is denoted as follows: $\pi(0)=1$, $\pi(1)=0, \pi(2)=4, \pi(3)=2, \pi(4)=3$.

<Permutation Pattern $\pi$>

Figure 5:
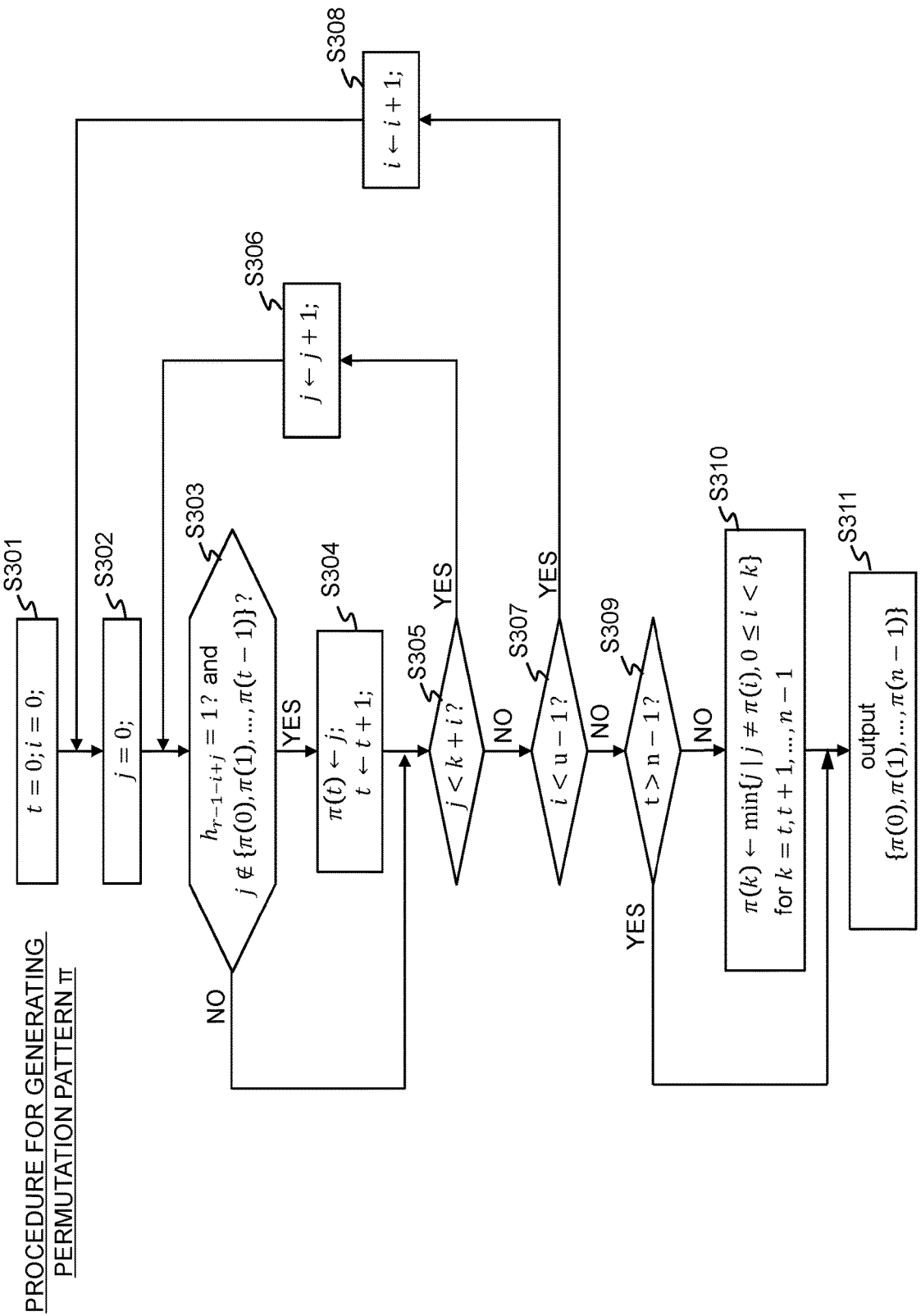
FIG. 5 is a flowchart illustrating an example of the permutation pattern generation procedure in FIG. 4.

FIG. 5 shows an example of a procedure for generating a permutation pattern $\pi$. The variables t, i and j are initialized (operations S301 and S302). If $h_{r-1-i+j}=1$ and j is not included in $\{\pi(0), \pi(1), \ldots, \pi(n-1)\}$ (YES in Operation S303), $\pi(t)$ is stored as j, and t is incremented by one (Operation S304). If $h_{r-1-i+j}$ is not 1 or j is included in $\{\pi(0), \pi(1), \ldots, \pi(n-1)\}$ (NO in Operation S303)), Operation S304 is not executed.

Subsequently, it is determined whether or not j is less than k+i (Operation S305). If j<k+i (YES in Operation S305), j is incremented by one (Operation S306), and the process returns to Operation S303. Hereinafter, while incrementing j, Operations S303 to S306 are repeated until j becomes equal to or more than (k+i). When j is equal to or more than (k+i) (NO in Operation S305), it is determined whether i is less than u−1 (Operation S307). If i<u−1 (YES in Operation S307), i is incremented by one (Operation S308), and the process returns to Operation S302 to initialize j. Hereinafter, while incrementing i, Operations S302 to S308 are repeated until i becomes (u−1) or more. Note that u is a positive integer equal to or smaller than r (the number of redundant bits), and Operation S307 means that only the first u bits of the redundant bits are dispersed by the permutation pattern.

When i becomes equal to or more than (u−1) (NO in Operation S307), it is determined whether or not t exceeds (n−1) (Operation S309). When t is equal to or smaller than (n−1) (NO in Operation S309), the following calculation is sequentially performed until the value of k reaches n−1 from t (Operation S310).

$$\pi(k) \leftarrow \min\{j | j \neq \pi(i), 0 \leq i < k\}$$

for $k=t, t+1, \ldots, n-1$  [Math.2]

If t exceeds (n−1) (YES in Operation S309), Operation S310 is not executed.

Thus, when t reaches (n−1), $\{\pi(0), \pi(1), \ldots, \pi(n-1)\}$ stored at that time is output as a permutation pattern $\pi$ (Operation S311).

Note that, as described above, u in Operation S307 is a parameter for dispersing only a part (the first u bits) of the redundant bits by the permutation pattern. Accordingly, if u=r, all redundant bits are dispersed in the information bit portions as illustrated in FIG. 1.

Generally, with respect to the n (=k+r)-length bit string $h_0$, $h_1, \ldots, h_{n-1}$ derived in Operation S202 in FIG. 4, the number of 1s included in the remaining, (k+1)-th and later bit string $h_{r-1}, h_r, \ldots, h_{n-1}$ corresponds to the time point at which the first redundant bit appears in the sequence interleaved by the permutation pattern $\pi$. In other words, assuming that the number of 1s included in the latter (k+1)-th and later bit sequence is w, the time point $t_0$ at which the first redundant bit (1st redundant bit in FIG. 1) appears is equal to w−1 ($t_0=w-1$) or $t_0<w$. Hereinafter, a specific example will be described.

2.3) Example

A specific example of a procedure for generating the permutation pattern $\pi$ shown in FIGS. 4 and 5 will be described. As an example, it is assumed that the number of information bits k=30, the number of redundant bits r=8, and the CRC polynomial $g(x)=x^8+x^2+x+1$. Note that the period p of the polynomial $g(x)$ is the smallest integer such that the polynomial $x^p-1$ is divisible by $g(x)$, and here p=127.

From the coefficients of the quotient polynomial $q(x)$ obtained by dividing the polynomial $x^p-1$ by $g(x)$, the following 38-bit (=k+r) bit sequence is obtained: $h_0h_1 \ldots h_{37}$=00110011010000101011010101000111000001.

The following permutation pattern $\pi(0), \pi(1), \ldots, \pi(37)$ is obtained from the 38-bit string by the procedure of FIG. 5: 0 2 7 9 11 12 14 16 18 22 23 24 30 1 3 8 10 13 15 17 19 25 <u>31</u> 4 20 26 <u>32</u> 5 21 27 <u>33</u> 6 28 <u>34</u> 29 <u>35</u> <u>36</u> <u>37</u>.

The underlined parts of the permutation patterns $\pi(0), \pi(1), \ldots, \pi(37)$ are the time points $t_0, t_1, \ldots, t_7$ at which the redundant bits appear, and the time points t=12, 22, 26, 30, 33, 35, 36, 37, respectively. The number of 1s contained in the above-mentioned bit string: $h_0h_1 \ldots h_{37}$=00110011010000101011010101000111000001 is 16 and the number of 1s, w, appearing in the latter 31 bits is 13. Accordingly, the first redundant bit appears at the time point t=w−1=12.

As described above, by adopting the redundant bit distribution arrangement according to the present method, it is possible to perform error detection at the time point t=w−1, the shortest possible time, before receiving all data, allowing the average time required for error detection to be shortened. In particular, the redundant bit generation device according to the present example calculates the redundant bits by the existing CRC operation before rearranging the data according to the permutation pattern generated from the same CRC polynomial. Accordingly, the data string in which redundant bits shown in FIG. 1 are dispersedly arranged can be obtained with a simple structure.

3. Second Exemplary Embodiment

The above-described data structure illustrated in FIG. 1 can be generated not only by the first exemplary embodiment described above but also by using the permutation pattern $\pi$ in the redundant bit generation process.

Figure 6:
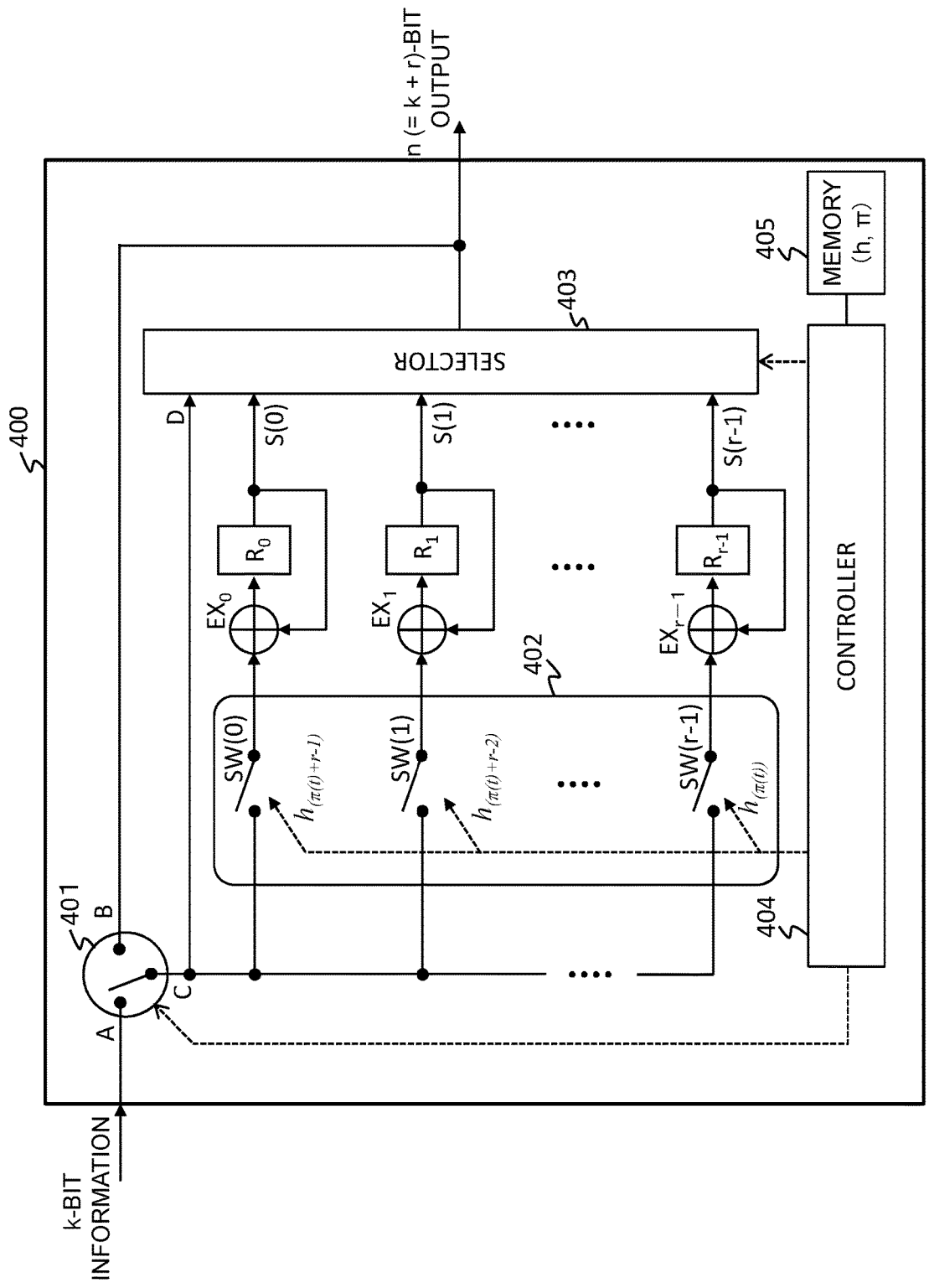
FIG. 6 is a block diagram showing a functional configuration of the redundant bit generation device according to a second exemplary embodiment of the present invention.

As illustrated in FIG. 6, the redundant bit generation device 400 according to the second exemplary embodiment of the present invention inputs a k-bit information bit string and outputs an n(=k+r)-bit data string in which r redundant bits are distributed as shown in FIG. 1. Hereinafter, the functional configuration and operation of the redundant bit generation device 400 according to the present example will be described.

3.1) Configuration

The redundant bit generation device 400 includes a selection switch 401, a switch group 402 including r switches SW(0) to SW(r−1), and r cumulative adders (a combination of an exclusive OR circuit EX and a 1-bit register R), a selector 403 for selecting one from input D and output S(i) of the cumulative adder, a controller 404 for controlling the selection switch 401, the switch group 402, and the selector 403; and a memory 405 for storing a bit string h of a length n and a permutation pattern π, which will be described later. Each cumulative adder is a circuit in which an exclusive OR circuit EXi and a one-bit register Ri are connected in series. Hereinafter, i=0, 1, . . . , r−1.

The selection switch 401 has a terminal A to which k-bit information is input, a terminal B to which an output of the selector 403 is input, and a terminal C which is selectively connected to the terminal A or B, where the terminal C is connected to each switch SW of the switch group 402 and one input D of the selector 403. The selection switch 401 selects either the k-bit information or the output of the selector 403 under the control of the controller 404, and outputs the selected bit to the switch group 402.

The switches SW(0), SW(1), . . . SW(r−1) of the switch group 402 are connected to exclusive OR circuits $EX_0$, $EX_1$, . . . , $EX_{r-1}$, and are subject to on-off control individually according to control signals $h_{\pi(t)+r-1}, h_{\pi(t)+r-2}, \ldots, h_{\pi(t)}$. These control signals $h_{\pi(t)+r-1-i}$ change at each time point t, and change the opening/closing (off/on) state of the switch group 402 at each time point, as described later. By such on-off control of the switch SW(i), it is determined whether or not to output the bit selected by the selection switch 401 to a corresponding cumulative adder.

Each exclusive OR circuit EXx is connected in series with the 1-bit register Ri, inputs the output bit of the corresponding switch SW(i) and the stored bit S(i) of the 1-bit register Ri, and calculates the exclusive OR thereof to output as a new to-be-held bit to the 1-bit register Ri. That is, the 1-bit registers $R_0$ to $R_{r-1}$ hold the cumulative addition results for the input bits selected by the switch group 402.

The selector 403 selects one from the output bit D of the terminal C of the selection switch 401 and the respective held bits S(0) to S(r−1) of the 1-bit registers $R_0$ to $R_{r-1}$ according to the control of the controller 404 to output it as a data string of n (=k+r) bits. As will be described later, the present apparatus can be used not only for generating redundant bits on the transmission side but also for performing error detection on the reception side.

3.2) Operation

Next, referring to FIGS. 6 and 7, an operation of the above-described redundant bit generation device 400 for obtaining an n-bit output in the format shown in FIG. 1 from k-bit input information will be described. First, it is assumed that the bits held in the 1-bit registers $R_0$ to $R_{r-1}$ have been initialized to 0, respectively.

Figure 7:
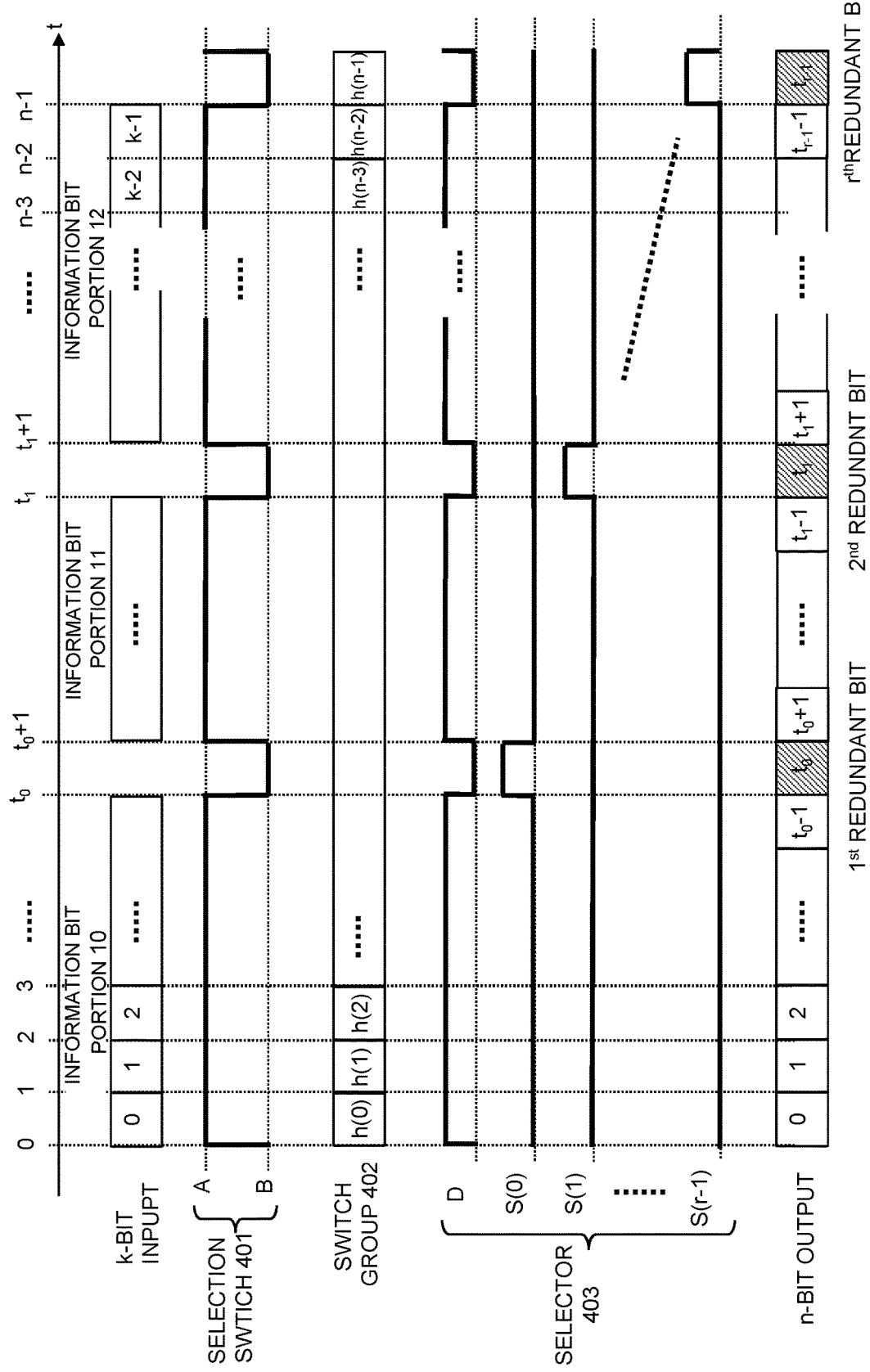
FIG. 7 is a time chart for explaining a redundant bit generation method according to the second exemplary embodiment.

In FIG. 7, while the first information bit portion 10 of the k-bit input information is input, the selection switch 401 selects the terminal A and sequentially outputs the input bits to the switch group 402. The input bit is provided to the exclusive OR circuits $EX_0$ to $EX_{r-1}$ of the cumulative adders through the switch group 402 in which each switch SW is subject to on-off control. The exclusive-OR circuits $EX_0$ to $EX_{r-1}$ perform the exclusive-OR of the input bit and the currently held bits of the 1-bit registers $R_0$ to $R_{r-1}$ to store the exclusive-OR results as new held bits in the one-bit registers R0 to Rr−1, respectively. During such an operation, the selector 403 selects the input D and outputs it as the first bit portion 0 to $t_0-1$ of the n-bit output. Therefore, as described above, the bit string output by the selector 403 from time 0 to time $t_0-1$ is the same as the input information bit portion 10.

At the next time point to, the selector 403 selects the held bit S(0) of the 1-bit register $R_0$ and outputs it as the first redundant bit, and the selection switch 401 selects the terminal B to output the output bit of the selector 403, that is, the first redundant bit, to the switch group 402. The first redundant bit is provided to the exclusive OR circuits $EX_0$ to $EX_{r-1}$ of the cumulative adders through the switch group 402 in which each switch SW is subject to on-off control. The held bits of the 1-bit registers $R_0$ to $R_{r-1}$ are updated by exclusive OR of the first redundant bit and the currently held bits of the 1-bit registers $R_0$ to $R_{r-1}$ as described above.

Subsequently, for a duration from time point $t_0+1$ to $t_1-1$, the input bits are output as they are and the data held in the 1-bit registers are updated, as in the operation from time points 0 to $t_0-1$. Accordingly, as described above, the bit string output by the selector 103 from the time point $t_0+1$ to the time point $t_1-1$ is the same as the input information bit portion 11.

At the next time point $t_1$, the selector 403 selects the held bit S(1) of the 1-bit register $R_1$ and outputs it as the second redundant bit. The selection switch 401 selects the terminal B to output the output bit of the selector 403, that is, the second redundant bit, to the switch group 402. The second redundant bit is provided to the exclusive OR circuits $EX_0$ to $EX_{r-1}$ of the cumulative adder through the switch group 402 in which each switch SW is subject to on-off control. The held bits of the 1-bit registers R0 to Rr−1 are updated by exclusive OR of the above-mentioned second redundant bit and the currently held bits of the 1-bit registers R0 to Rr−1.

For a subsequent duration from $t_1+1$ to $t_2-1$, the input bits are output as they are and the data held in the 1-bit register is updated, as in the operation from time point 0 to $t_0-1$. Similarly, the data held in the 1-bit register is updated while the information bit is output as it is, and the redundant bit is output by the selector 403 selecting the data held in the corresponding 1-bit register, to the switch group 402 through the selection switch 401.

3.3) Bit String h and Permutation Pattern π

The bit string $h_0, h_1, \ldots, h_{n-1}$ of length n and the permutation pattern π stored in the memory 405 are calculated from the CRC polynomial in the same manner as in the first exemplary embodiment described above.

Figure 8:
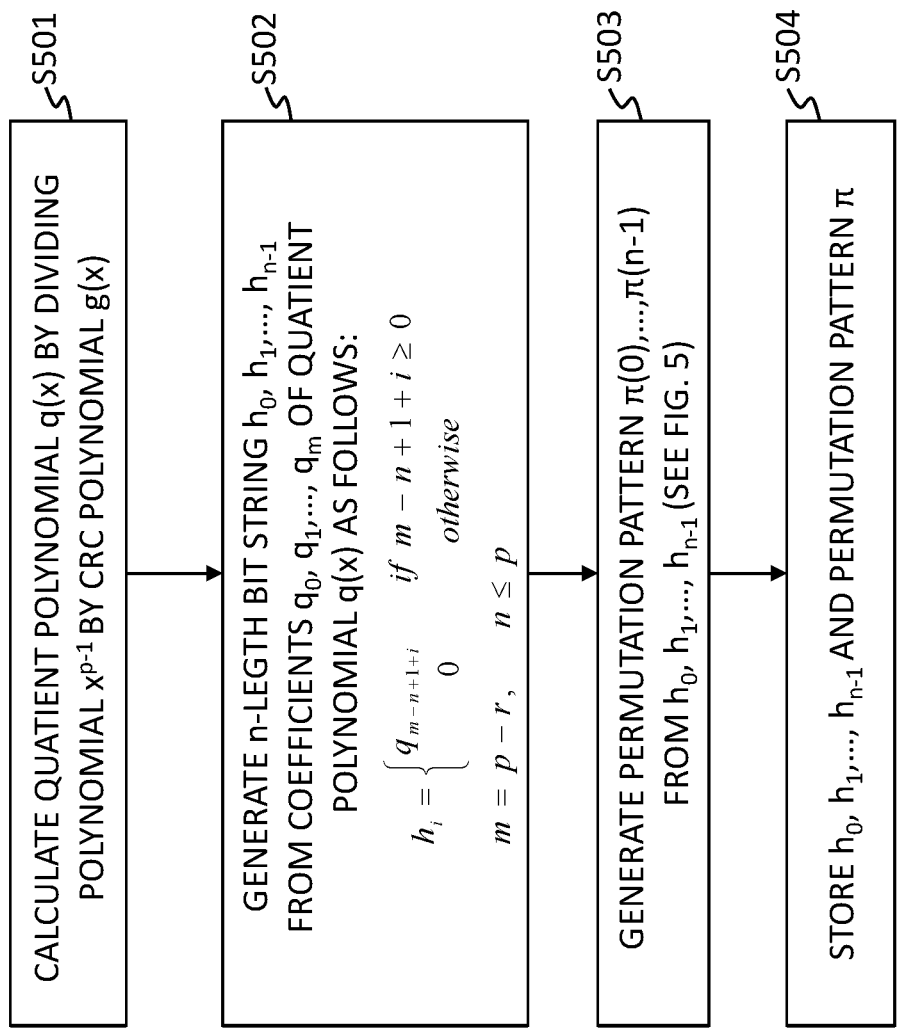
FIG. 8 is a flowchart showing an example of a procedure for generating a bit string h of length n and a permutation pattern π in the redundant bit generation method according to the second exemplary embodiment.

In FIG. 8, first, assuming that the degree of the CRC polynomial g(x) is r and the period is p, the quotient polynomial $q(x)=q_0+q_1 x+ \ldots +q_m x^m$ is calculated by dividing the polynomial $x^p-1$ by the CRC polynomial g(x) (Operation S501). Subsequently, from the coefficients $q_0, q_1, \ldots, q_m$ of the quotient polynomial q(x), bit string $h_0, h_1, \ldots, h_{n-1}$ of length n is generated by the above-mentioned equation (1) (Operation S502).

Subsequently, the permutation pattern π(0), π(1), . . . , π(n−1) necessary to calculate time points $t_0, t_1, \ldots, t_{r-1}$ at which the redundant bits are output as mentioned above is generated from the generated bit string $h_0, h_1, \ldots, h_{n-1}$ according to a predetermined procedure (see FIG. 5) (Operation S503). The bit string $h_0, h_1, \ldots, h_{n-1}$ and the permutation patterns π(0), π(1), . . . , π(n−1) obtained are stored in the memory 405 (operation S504).

The controller 404 determines the opening or closing state of each switch SW of the switch group 402 at each time point t=0, 1, 2, . . . , n−1 using the permutation pattern π and the bit string $h_0, h_1, \ldots, h_{n-1}$. More specifically, at time t, the switch SW(i) is closed (on) if $h_{\pi(t)+r-1-i}=1$, and is opened (off) otherwise. If the value of π(t)+r−1−i is out of the range of 0 to n−1, each switch SW(i) is opened (off).

Further, the controller 404 determines time point $t_i$ ($t_0, t_1, \ldots, t_{r-1}$) at which the selector 403 selects the redundant bits as mentioned above while changing selection of the signal at the time points t=0, 1, 2, . . . , n−1, according to the following equation:

$$t_i = \pi^{-1}(k+i).$$

Here, $\pi^{-1}$ is the inverse of the above-described permutation pattern π, k is the number of information bits, and i is an integer between 0 and r−1. Accordingly, the selector 403 selects the held bit S(i) of the 1-bit register $R_i$ at the time point $t_i = \pi^{-1}(k+i)$ and outputs the selected bit as the i-th redundant bit. At other time points, the selector 403 selects the input data D to output it.

As described above, the redundant bit generation device 400 according to the second embodiment of the present invention inputs a k-bit information bit string and outputs n(=k+r)-bit data string in which r redundant bits are distributed as shown in FIG. 1.

3.4) Error Detection

The redundant bit generation device 400 illustrated in FIG. 6 can be used not only for generation of redundant bits on the transmission side, but also for error detection on the reception side. In the case where the data illustrated in FIG. 1 is transmitted, an error included in the received data is detected by employing the reverse procedure of the encoding.

Figure 9:
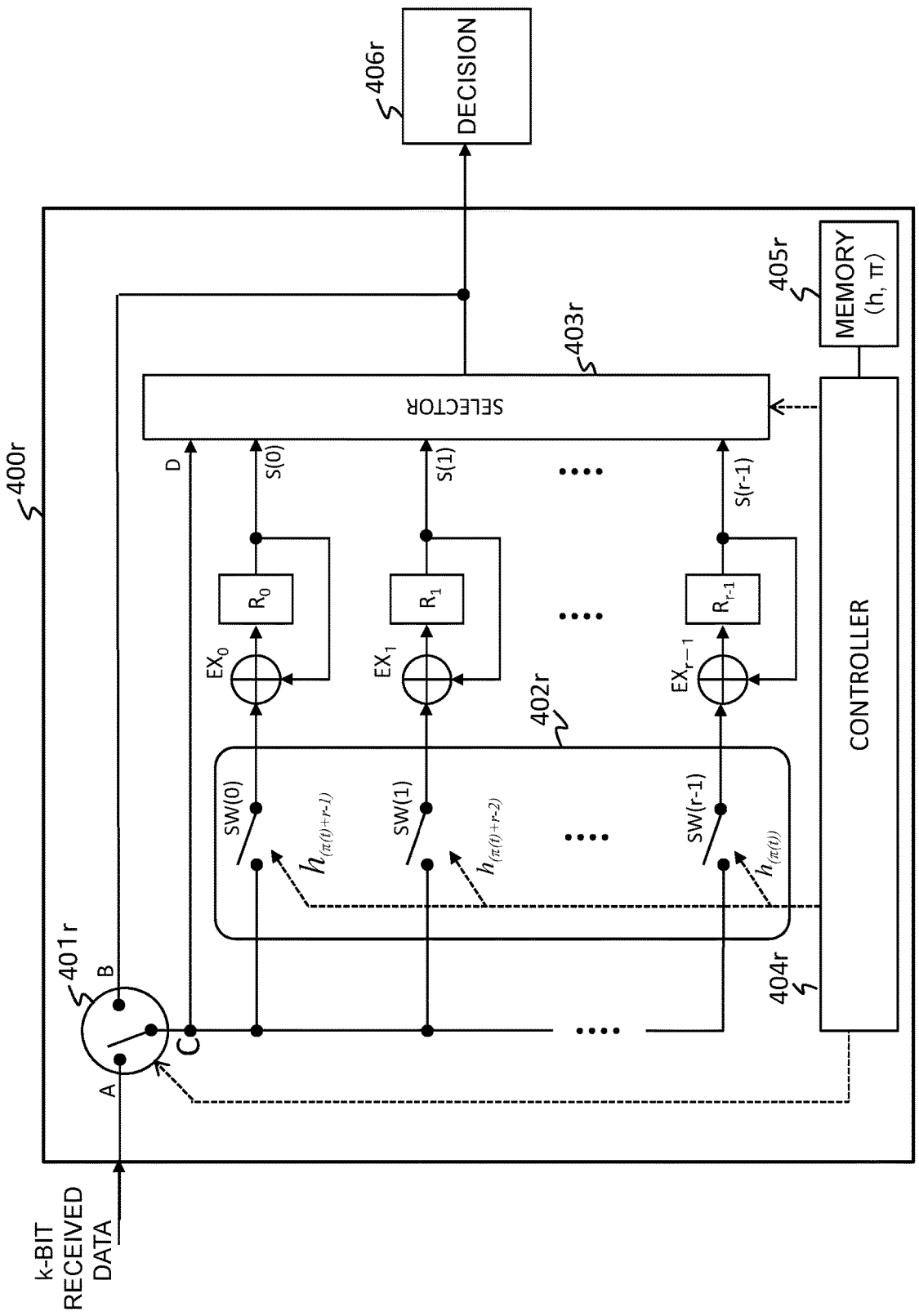
FIG. 9 is a block diagram showing a functional configuration of an error detection device equipped with the redundant bit generation device according to the second exemplary embodiment of the present invention.

As illustrated in FIG. 9, the error detecting device 400r on the receiving side has a circuit configuration similar to that of the redundant bit generating device illustrated in FIG. 6. Accordingly, these elements are distinguished from those in FIG. 6 by the suffix "r" on the reference numerals in FIG. 6. The switch group 402r inputs the information bit portion or the redundant bit portion of the received data through the selection switch 401r, and outputs them to the cumulative adder under the control of the controller 404r. Each of the cumulative adders calculates the redundant bit S(i), and the selector 403r selects the received data D or the calculated redundant bit S(i). The bit selected by the selector 403r is output to the decision unit 406r, and the decision unit determines whether the redundant bit in the received data matches the calculated redundant bit. If the redundant bit calculated from the received information bits match the received redundant bit, it is determined that there is no error, and if they do not match, it is determined that there is an error. Therefore, the circuit configuration of the redundant bit generation device as shown in FIG. 6 can be applied to the decoder on the receiving side.

3.5) Effects

As described above, according to the second exemplary embodiment of the present invention, the redundant bits dispersedly arranged in the data structure shown in FIG. 1 can be used to check whether an error is included in received data located in the left side of a redundant bit. That is, it is possible to determine the presence or absence of an error at the time of reading out an intermediate redundant bit without referring to all the information bits of the received data string, allowing the time required for error detection to be reduced on average. In particular, there is an advantage that the configuration of the redundant bit generation device shown in FIG. 6 can be used for error detection on the receiving side as it is. Further, the redundant bit generation device 400 according to the present exemplary embodiment has an advantage that the interleaver 102 in the first exemplary embodiment is not required, thereby eliminating a delay of one frame caused by passing through the interleaver 4. Third Exemplary Embodiment The same functions as those of the devices according to the first and second exemplary embodiments described above can be realized by executing programs on a processor.

Figure 10:
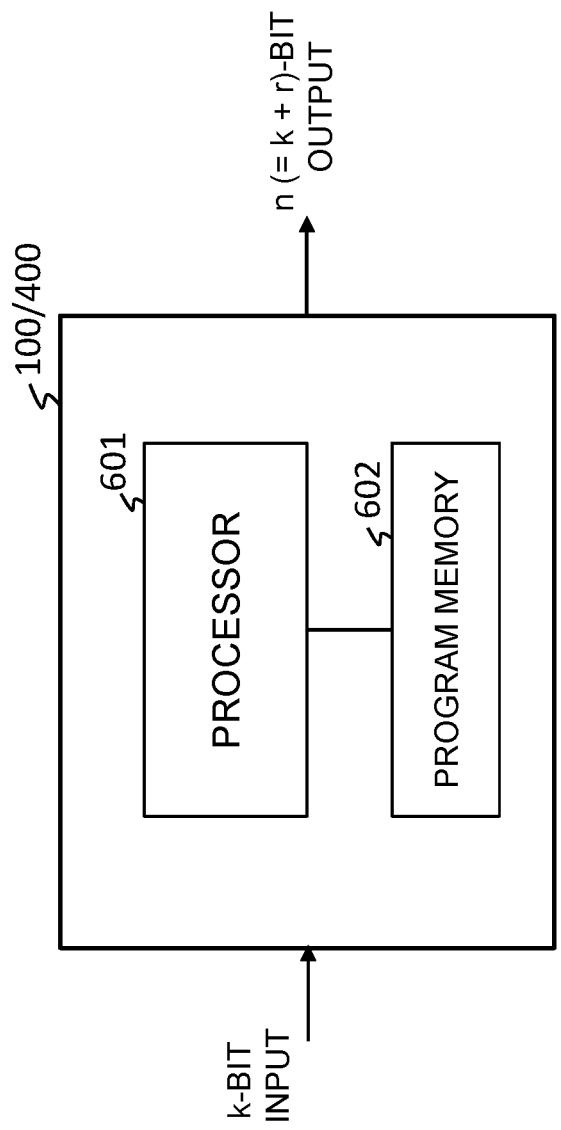
FIG. 10 is a block diagram illustrating a schematic configuration of an information processing apparatus that implements the function of the redundant bit generation device according to the above-described embodiment by a computer program.

As illustrated in FIG. 10, in an information processing device including a processor 601 and a program memory 602, the processor 601 reads a necessary program from the program memory 602 to execute the read program, whereby allowing the circuit configuration illustrated in FIGS. 2 and 6 to be implemented by software. The processor 601 is also called a CPU (Central Processing Unit) or a computer. The program memory 602 may be a read-only memory, a readable/writable memory, a memory built in the apparatus, or a removable memory.

5. Application Example

Next, there will be described an example in which the redundant bit generation device according to the first or second exemplary embodiment as described above is applied to an encoding device and a decoding device for Polar code known as an error correction technique will be described.

Figure 11:
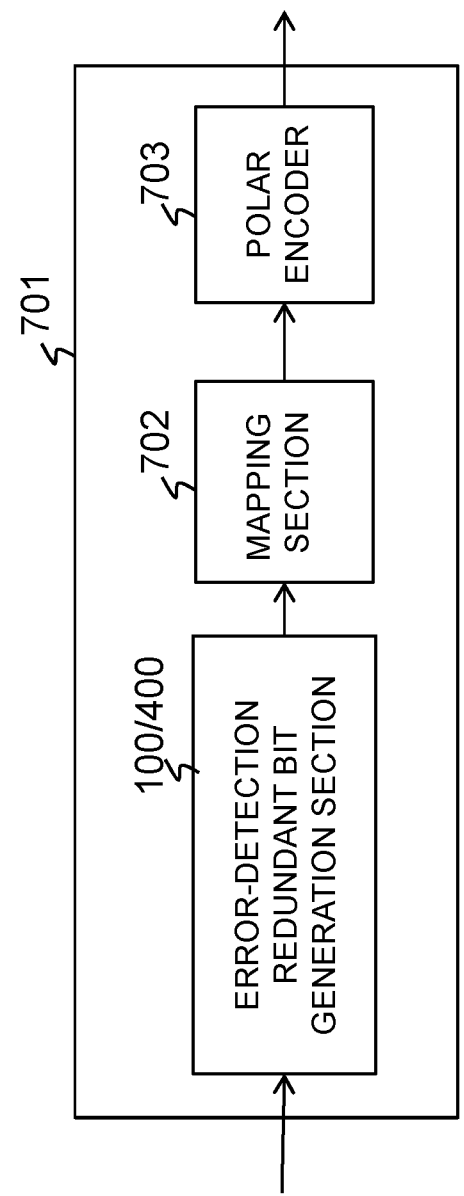
FIG. 11 is a block diagram showing an example of a Polar encoding device to which the redundant bit generation device according to the present invention is applied.

As illustrated in FIG. 11, an encoding device 701 includes an error-detection redundant bit generation section 100 or 400 according to the above exemplary embodiment of the present invention, a mapping section 702 for assigning output data of the error-detection redundant bit generation section to locations of the information bits of Polar code, and a Polar encoder 703 that polar-encodes the mapped data. As illustrated in FIG. 1, the error-detection redundant bit generation section 100 or 400 outputs a data frame in which redundant bits for error detection are dispersedly arranged for input information bits, and the Polar encoder 703 performs the encoding to output a corresponding bit string.

Figure 12:
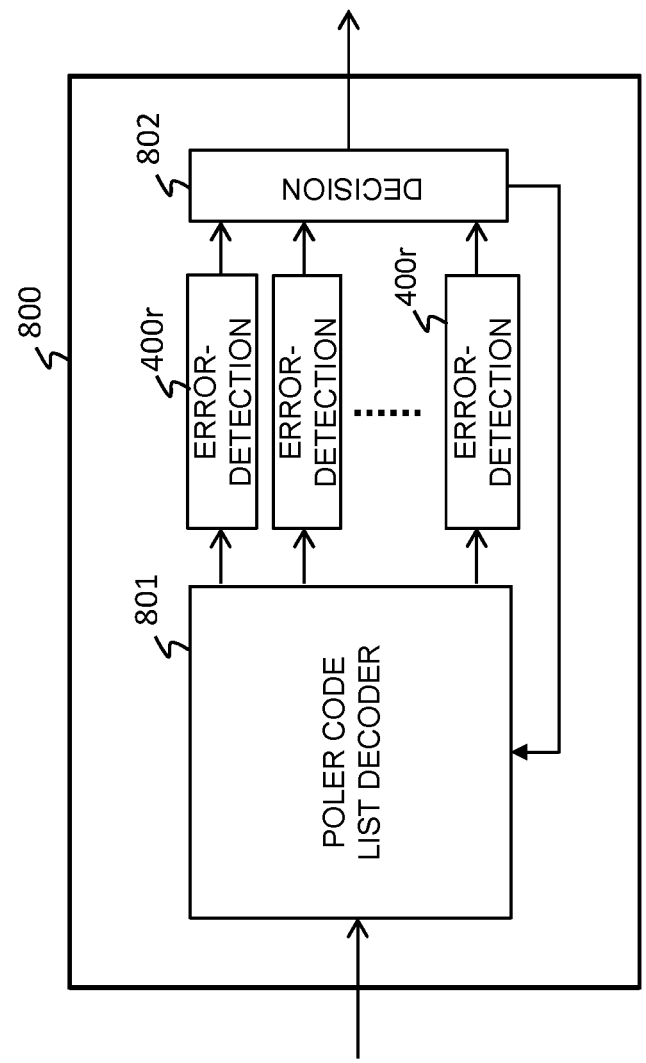
FIG. 12 is a block diagram showing an example of a Polar decoding device using the error detection device according to the present invention.

As illustrated in FIG. 12, a decoding apparatus to which the redundant bit generation circuit according to the first or second exemplary embodiment is applied has such a structure that an well-known Polar code list decoder 801 is followed by error detection sections according to the above exemplary embodiment of the present invention and a decision section 802. The Polar code list decoder 801 sequentially outputs as many transmission bit string candidates as the predetermined list size from the reception bit strings including an error due to noise or the like. The error detecting device 400r sequentially checks each bit string output for the presence or absence of an error, and the decision section 802 determines that a candidate for which no error has been detected by the CRC is a correct result. If errors are detected for all candidates, the process terminates at that time point.

As described above, according to the present embodiment, it is possible to determine the presence or absence of an error at the time of reading a redundant bit in the middle without referring to all information bits of the received data sequence, allowing application to a Polar-code decoder. Accordingly, it is possible to reduce the time required for error detection on average.

Application software in accordance with the present disclosure, such as computer programs executed by the device and may be stored on one or more computer readable mediums. It is also contemplated that the steps identified herein may be implemented using one or more general purpose or specific purpose computers and/or computer systems, networked and/or otherwise. Where applicable, the ordering of various steps described herein may be changed, combined into composite steps, and/or separated into substeps to provide features described herein.

It should also be understood that embodiments of the present disclosure should not be limited to these embodiments but that numerous modifications and variations may be made by one of ordinary skill in the art in accordance with the principles of the present disclosure and be included within the spirit and scope of the present disclosure as hereinafter claimed.

INDUSTRIAL APPLICABILITY

The present invention is applicable to an encoder and a decoder including a redundant bit generation circuit for error detection in communication systems.

REFERENCE SIGNS LIST 10-13 information bit portion
20-23 redundant bit
30 CRC calculation
31 CRC polynomial
32 permutation pattern
33 bit interleaving
100 redundant bit generation device
101 CRC calculator
102 interleaver
400 redundant bit generation section
401 selection switch
402 switch group
403 selector
404 controller

The invention claimed is:

1. An encoding device comprising:
an encoder configured to input an information bit string and generate an output data string including redundant bits for error detection, that are added to the information bit string by:
generating a predetermined number of redundant bits from the information bit string according to a cyclic redundancy check (CRC) polynomial; and
dispersedly arranging the predetermined number of redundant bits within the information bit string using a permutation pattern determined based on the CRC polynomial, to generate the output data string;
a mapping unit configured to assign the output data string to locations of information bits of a Polar code to generate mapped data; and
a Polar encoder that polar-encodes the mapped data; and transmitting the polar-encoded mapped data in a digital data communications system.

2. The encoding device according to claim 1, wherein the permutation pattern is generated from a bit pattern of the same length as the output data string,
wherein the encoder is further configured to use the permutation pattern to change bit order of the bit pattern to dispersedly arrange the predetermined number of redundant bits in the information bit string.

3. The encoding device according to claim 2, wherein the encoder is further configured to arrange a first redundant bit that first appears in the output data string at a time point indicating a value smaller than a count of 1s included in the bit pattern according to the permutation pattern.

4. The encoding device according to claim 2, wherein the encoder is further configured to:
generate the bit pattern from coefficients of a quotient polynomial q(x) which is obtained by dividing a polynomial $x^p-1$ by the CRC polynomial g(x), and
generate the permutation pattern from positions of 1s in the bit pattern.

5. A device for generating redundant bits for error detection, that are added to a block of information bits, comprising:
a number of on-off switches that input the information bits, wherein the number is identical to a count of redundant bits calculated from a cyclic redundancy check (CRC) polynomial;
cumulative adders configured to calculate the redundant bits by individually accumulating outputs of the number of on-off switches;
a selector that selects one of an input information bit and the redundant bits calculated respectively by the cumulative adders, to generate a data string including the information bits and the redundant bits added thereto; and
a controller configure to control the on-off switches and the selector using a permutation pattern determined based on the CRC polynomial.

6. The device according to claim 5, wherein the permutation pattern is generated from a predetermined bit pattern of the same length as the output data string,
wherein the controller performs on-off control of each on-off switches according to a permutation result of the predetermined bit pattern using the permutation pattern, and performs selection control of the selector according to arrangement of the redundant bits determined based on the permutation pattern.

7. The device according to claim 6, wherein a first redundant bit that first appears in the output data string is arranged at a time point indicating a value smaller than a count of 1s included in the bit pattern according to the permutation pattern.

8. The device according to claim 6, wherein the predetermined bit pattern is generated from coefficients of a quotient polynomial q(x) which is obtained by dividing a polynomial $x^p-1$ by the CRC polynomial g(x), and the permutation pattern is generated from positions of 1s in the bit pattern.

9. An encoding method of an encoding device comprising:
by an encoder, inputting an information bit string;
generating a predetermined number of redundant bits from the information bit string according to a cyclic redundancy check (CRC) polynomial; and
dispersedly arranging the predetermined number of redundant bits within the information bit string using a permutation pattern determined based on the CRC polynomial, to generate the output data string including redundant bits for error detection, that are added to the information bit string;
by a mapping unit, assigning the output data string to locations of information bits of a Polar code to generate mapped data;

by a Polar encoder, polar-encoding the mapped data; and
transmitting the polar-encoded mapped data in a digital data communications system.

10. The encoding method according to claim 9, wherein the permutation pattern is generated from a bit pattern of the same length as the output data string,
wherein by the encoder, the permutation pattern is used to change bit order of the bit pattern to dispersedly arrange the predetermined number of redundant bits in the information bit string.

11. The encoding method according to claim 10, wherein by the encoder a first redundant bit that first appears in the output data string is arranged at a time point indicating a value smaller than a count of 1s included in the bit pattern according to the permutation pattern.

12. The encoding method according to claim 10, wherein by the encoder, the bit pattern is generated from coefficients of a quotient polynomial q(x) which is obtained by dividing a polynomial $x^p-1$ by the CRC polynomial g(x), and
the permutation pattern is generated from positions of 1s in the bit pattern.

13. A method for generating redundant bits for error detection, that are added to a block of information bits, comprising:
by a number of on-off switches, inputting the information bits and passing or blocking an information bit according to a first control signal, wherein the number is identical to a count of redundant bits calculated from a cyclic redundancy check (CRC) polynomial;
by cumulative adders, calculating the redundant bits by individually accumulating outputs of the number of on-off switches;
by a selector, selecting one of an input information bit and the redundant bits calculated respectively by the cumulative adders, to generate a data string including the information bits and the redundant bits added thereto, according to a second control signal; and
by a controller, outputting the first control signal and the second control signal for controlling the on-off switches and the selector using a permutation pattern determined based on the CRC polynomial.

14. The method according to claim 13, wherein the permutation pattern is generated from a predetermined bit pattern of the same length as the output data string,
wherein the controller generates the first control signal according to a permutation result of the predetermined bit pattern using the permutation pattern, and the second control signal according to arrangement of the redundant bits determined based on the permutation pattern.

15. The method according to claim 14, wherein a first redundant bit that first appears in the output data string is arranged at a time point indicating a value smaller than a count of 1s included in the bit pattern according to the permutation pattern.

16. The method according to claim 14, wherein the predetermined bit pattern is generated from coefficients of a quotient polynomial q(x) which is obtained by dividing a polynomial $x^p-1$ by the CRC polynomial g(x), and the permutation pattern is generated from positions of 1s in the bit pattern.

17. A device for detecting errors using redundant bits enabling error detection, that are added to a block of information bits, comprising:
a number of on-off switches that input the information bits, wherein the number is identical to a count of redundant bits calculated from a cyclic redundancy check (CRC) polynomial;
cumulative adders that calculate the redundant bits by individually accumulating outputs of the number of on-off switches;
a selector that selects one of an input information bit and the redundant bits calculated respectively by the cumulative adders, to generate a data string including the information bits and the redundant bits added thereto;
a controller that controls the on-off switch means and the selection means using a permutation pattern determined based on the CRC polynomial; and
a decision unit configured to decide whether an error exists or not, by comparing a redundant bit of the received data to a redundant bit calculated.

18. The device according to claim 17, wherein the permutation pattern is generated from a predetermined bit pattern of the same length as the output data string,
wherein the control means performs on-off control of each on-off switches according to a permutation result of the predetermined bit pattern using the permutation pattern, and performs selection control of the selector according to arrangement of the redundant bits determined based on the permutation pattern.

19. The device according to claim 18, wherein a first redundant bit that first appears in the output data string is arranged at a time point indicating a value smaller than a count of 1s included in the bit pattern according to the permutation pattern.

20. The device according to claim 18, wherein the predetermined bit pattern is generated from coefficients of a quotient polynomial q(x) which is obtained by dividing a polynomial $x^p-1$ by the CRC polynomial g(x), and the permutation pattern is generated from positions of 1s in the bit pattern.

21. A decoder comprising:
an error-correction decoder that decodes received error-correction code to output received data; and
the device according to claim 17, wherein the device inputs the received data,
wherein when the decision unit of the device decides that an error exists, decoding process of the error-correction decoder is interrupted.

22. A non-transitory recording medium storing a program for controlling a processor to function as an encoding device, the program comprising instructions that when executed by the processor:
input an information bit string;
generate a predetermined number of redundant bits from the information bit string according to a cyclic redundancy check (CRC) polynomial; and
dispersedly arrange the predetermined number of redundant bits within the information bit string using a permutation pattern determined based on the CRC polynomial, to generate the output data string including redundant bits for error detection, that are added to the information bit string;
assign the output data string to locations of information bits of a Polar code to generate mapped data;
polar-encode the mapped data; and
transmitting the polar-encoded mapped data in a digital data communications system.

23. A non-transitory recording medium storing a program for functioning a computer as a device for generating redundant bits for error detection, that are added to a block of information bits, the program comprising:

- by a number of on-off switches, inputting the information bits, wherein the number is identical to a count of redundant bits calculated from a cyclic redundancy check (CRC) polynomial;
- by cumulative adders, calculating the redundant bits by individually accumulating outputs of the number of on-off switches;
- by a selector, selecting one of an input information bit and the redundant bits calculated respectively by the cumulative adders, to generate a data string including the information bits and the redundant bits added thereto; and
- by a controller, controlling the on-off switches and the selector using a permutation pattern determined based on the CRC polynomial.

24. A non-transitory recording medium storing a program for detecting errors using redundant bits enabling error detection, that are added to a block of information bits, the program comprising:

- by a number of on-off switches, inputting the information bits, wherein the number is identical to a count of redundant bits calculated from a cyclic redundancy check (CRC) polynomial;
- by cumulative adders, calculating the redundant bits by individually accumulating outputs of the number of on-off switches;
- by a selector, selecting one of an input information bit and the redundant bits calculated respectively by the cumulative adders, to generate a data string including the information bits and the redundant bits added thereto;
- by a controller, controlling the on-off switches and the selector using a permutation pattern determined based on the CRC polynomial; and
- by a decision unit, deciding on whether an error exists or not, by comparing a redundant bit of the received data to a redundant bit calculated.

* * * * *